United States Patent [19]

Cleeves et al.

[11] Patent Number: 5,091,047

[45] Date of Patent: Feb. 25, 1992

[54] PLASMA ETCHING USING A BILAYER MASK

[75] Inventors: James M. Cleeves, Redwood City; James G. Heard; Zoilo C. H. Tan, both of Cupertino, all of Calif.

[73] Assignee: National Semiconductor Corp., Santa Clara, Calif.

[21] Appl. No.: 733,473

[22] Filed: Jul. 22, 1991

Related U.S. Application Data

[62] Division of Ser. No. 210,211, Jun. 17, 1988, Pat. No. 5,045,150.

[51] Int. Cl.$^5$ .......................... B44C 1/22; C03C 15/00; C03C 25/06; C23F 1/00
[52] U.S. Cl. .................................... 156/643; 156/646; 156/653; 156/656; 156/657; 156/659.1; 156/661.1; 156/904; 204/192.37

[58] Field of Search ............... 156/643, 646, 653, 656, 156/657, 659.1, 661.1, 904; 204/192.32, 192.37; 252/79.1; 427/38, 39

[56] References Cited

U.S. PATENT DOCUMENTS 4,092,210  5/1978  Hoepfner ..................... 156/661.1 X
4,484,978  11/1984  Keyser .............................. 156/643

Primary Examiner—William A. Powell
Attorney, Agent, or Firm—Townsend and Townsend

[57] ABSTRACT

A bilayer mask is utilized for etching a primary layer, which may be either an aluminum metallization layer or a dielectric layer. The bilayer mask includes both a thin resist layer and a metal imaging layer. The thin resist layer provides for high resolution patterning of the metal imaging layer. The metal imaging layer, in turn, provides for durability to withstand subsequent plasma etching of the underlying primary layer.

7 Claims, 1 Drawing Sheet

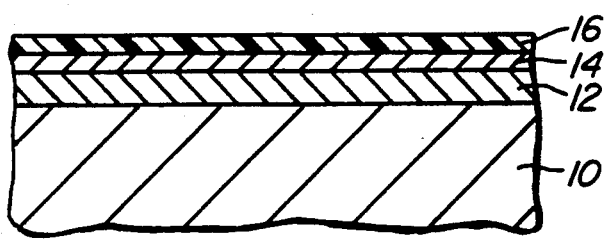
FIG._1.
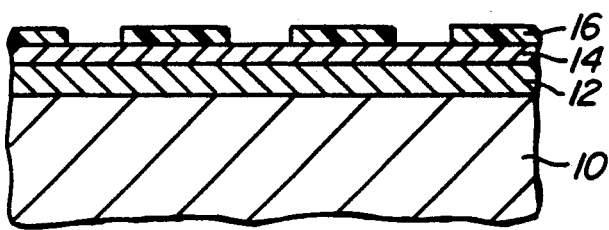
FIG._2.
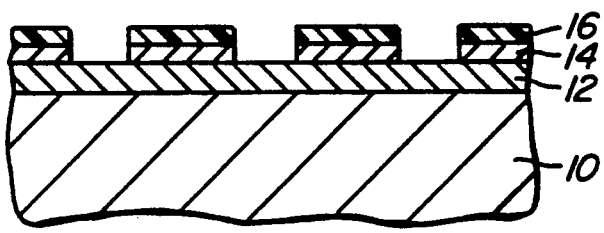
FIG._3.
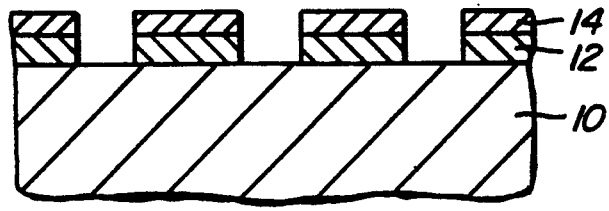
FIG._4.

PLASMA ETCHING USING A BILAYER MASK

This is a division of application Ser. No. 07/210,211 filed June 17, 1988, now U.S. Pat. No. 4,045,150.

BACKGROUND OF THE INVENTION

1. Field of the Invention

The present invention relates generally to the field of semiconductor fabrication, and more particularly to a method for plasma etching using a bilayer mask in order to define very small geometries on a semiconductor substrate.

2. Description of the Background Art

As the drive to increase device density continues, it becomes increasingly necessary to be able to define very small geometries on the surface of a semiconductor substrate. To form such small geometries, it is highly desirable to use very thin resist layers which provide for precise replication of the projected masking pattern. Image resolution and definition are lost as the thickness of the photoresist layer increases.

The ability to utilize very thin photoresist layers, however, is limited by the need to provide a resist layer which is sufficiently thick to withstand the etching of the underlying layer which is being patterned through the resist mask. In particular, plasma etching often requires a relatively thick resist layer since it is a relatively lengthy process and many etchant gases directly attack the resist material. For that reason, the resist layers used as masks in plasma etching processes are often too thick to allow for submicron geometries, as is frequently desired.

For the above reasons, it would be desirable to provide methods which would combine the advantages of a thin resist layer, i.e., high image resolution, definition, and control, with the ability to withstand the relatively harsh conditions associated with plasma etching.

SUMMARY OF THE INVENTION

The present invention provides for high resolution plasma etching of a primary layer on a semiconductor substrate and is particularly suitable for forming submicron geometries. The present invention utilizes a bilayer mask, including a metal image layer formed over the primary layer and a very thin resist layer formed directly over the metal image layer. The thin resist layer is patterned by conventional techniques, where the thinness of the layer allows for a very high resolution and definition of the desired pattern. The resist mask is then used to etch the metal image layer under conditions which are highly selective for the metal over the resist. The metal image layer mask is then used to pattern the primary layer under more rigorous plasma etch conditions.

In a first exemplary embodiment, the primary layer is aluminum and the metal image layer is chromium. The chromium layer is patterned using the resist mask and a conventional wet chromium etchant, such as ceric ammonium sulfate-based etchants. The resulting chromium mask is then used to pattern the underlying aluminum layer, typically with a chlorine plasma etch.

In a second exemplary embodiment, the primary layer is an organic or inorganic dielectric and the metal image layer is aluminum. The aluminum is wet or dry etched using the thin layer resist as a mask, and the patterned aluminum layer in turn acts as a mask for plasma etching the dielectric. A fluorine plasma etch is typically used with inorganic dielectric layers, such as silicon oxide and silicon nitride, while an oxygen plasma may be used with organic polymeric dielectrics.

BRIEF DESCRIPTION OF THE DRAWINGS

FIG. 1 illustrates a conventional semiconductor substrate having a primary layer, a metal image layer, and a resist layer formed successively over its surface.

FIG. 2 illustrates the structure of FIG. 1, wherein the resist layer has been patterned.

FIG. 3 illustrates the structure of FIG. 2, wherein the metal image layer has been patterned using the resist layer as a mask.

FIG. 4 illustrates the structure of FIG. 3, wherein the primary layer has been patterned using the metal image layer as a mask.

DESCRIPTION OF THE PREFERRED EMBODIMENTS

Referring generally to FIGS. 1-4, specific methods will be described for fabricating semiconductor devices according to the method of the present invention.

Semiconductor devices are fabricated on silicon wafer substrates 10 (a portion of one being illustrated in FIGS. 1-4). Usually, the wafer will include a variety of features (not illustrated) formed on its upper surface, including transistors, resistors, capacitors, and the like.

According to the present invention, a primary layer 12, which is either an aluminum layer or a dielectric layer, will be formed over the substrate 10 using conventional techniques. The primary layer 12 is patterned using a bilayer mask including a metal imaging layer 14 and a resist layer 16, which is specifically intended to provide for high resolution plasma etching of the primary layer.

In a first embodiment of the invention, the primary layer 12 is an aluminum layer formed by conventional techniques, such as sputter deposition or evaporation. Usually, the aluminum layer 12 will be a metallization layer intended for interconnecting the various features formed on the substrate 10.

When the primary layer 12 is aluminum, the metal imaging layer will be chromium, typically applied by sputter deposition or evaporation. The chromium layer 14 must be sufficiently thick to withstand the subsequent plasma etching of the primary layer 12, as described hereinafter. Thicknesses in the range from 100 to 1000 Å, more usually in the range from about 500 to 1000 Å, are suitable.

In an alternate embodiment, the primary layer 12 is a dielectric layer, including both inorganic dielectrics such as silicon oxide and silicon nitride as well as organic dielectrics, such as polyimides. The dielectric layer 12 is formed by conventional techniques. In the case of inorganic dielectrics, such techniques include thermal oxidation (for silicon oxides) and chemical vapor deposition (CVD). In the use of organic dielectrics, a liquid resin may be applied by conventional spin-on techniques.

For dielectric primary layers 12, the metal imaging layer 14 will be aluminum. Again, the aluminum layer 14 will be sufficiently thick to act as a mask during subsequent plasma etching of the primary dielectric layer 12. Thicknesses in the range from about 100 to 1000 Å, more usually in the range from about 200 to 500 Å, are suitable.

The nature of the resist layer 16 is not dependent on the nature of the primary layer 12, but must be able to protect the underlying metal imaging layer 14. Suitable resist materials include photoresists, electron beam resists, and x-ray resists. The thickness of the resist layer will depend both on the desired image resolution and on the need to cover irregular surface topographies. With planarized surfaces, resists as thin as 0.2 μm may be employed, providing for etched geometries of 0.5 μm and below. In the case of irregular surface topographies, resist layers having a thickness in the range from about 1 to 2 μm may find use. The resists are applied by conventional spin-on techniques to the desired thickness, and cured.

Referring now to FIG. 2, the resist layer 16 is patterned by conventional techniques, such as light exposure for photoresists, electron beam exposure for electron beam resist, and x-ray exposure for x-ray resists. After exposure, the resists are developed to provide a desired mask for subsequent etching of the underlying metal imaging layer 14.

Once the resist layer 16 has been patterned, it is used as a mask for etching the metal image layer 14, as illustrated in FIG. 3. The chromium metal imaging layer 14 may be etched using conventional wet etchants, such as ceric ammonium sulfate-based etchants, at room temperature. The aluminum metal imaging layer 14 may be wet etched using a phosphoric/nitric acid mixture, or may be dry etched using a chlorine plasma, such as $CCl_3$, $CCl_4$, HCl, $Cl_2$, or $BCl_3$.

After patterning, the metal imaging layer 14 is used as a mask for plasma etching the primary layer 12. In the case of an aluminum primary layer 12, a chlorine plasma i employed as described above. In the case of a dielectric primary layer, the nature of the plasma will depend on the nature of the dielectric. In the case of organic dielectrics, such as polyimides, an oxygen plasma is suitable. In the case of inorganic dielectrics, such as silicon dioxide and silicon nitride, fluorine plasmas such as $CF_4$, $CHF_3$, and the like, will find use.

After etching, the substrate will appear as illustrated in FIG. 4, with the resist layer 16 having been removed during the plasma etch of the primary layer. If desired, the metal imaging layer 14 may be removed by conventional techniques. The chromium imaging layer can be removed by wet etching with ceric ammonium sulfate-based etchants or with an oxygen plasma. An aluminum metal imaging layer 14 can be removed by wet etching using a phosphoric acid/nitric acid mixture at an elevated temperature, typically about 70° C., or by dry etching with a chlorine-based plasma.

Use of the present invention provides for high resolution plasma etching of both aluminum metallization layers and organic and inorganic dielectric layers. By employing a bilayer mask including both a metal imaging layer and a resist layer, very thin resist layers providing for high resolution and definition can be utilized. By then using the photoresist to pattern the metal imaging layer, a mask combining both the high resolution of a thin photoresist and the durability of a metal is achieved.

Although the foregoing invention has been described in some detail by way of illustration and example for purposes of clarity of understanding, it will be obvious that certain changes and modifications may be practiced within the scope of the appended claims.

What is claimed is:

1. A method for etching a silicon dioxide dielectric layer on a semiconductor substrate, said method comprising:

forming a layer of aluminum having a thickness in the range from about 100 to 1000 Å over the dielectric layer;

forming a thin resist layer having a thickness in the range from about 0.2 to 2 μm over the aluminum layer;

photolithographically patterning the resist layer to form a first mask;

etching the aluminum layer through the first mask to form a second mask;

plasma etching the dielectric layer through the second mask with a fluorinated hydrocarbon or oxygen plasma, wherein said plasma etching removes the resist layer from the aluminum layer.

2. A method as in claim 1, wherein the resist is a photoresist having a thickness in the range from about 0.2 to 2 μm.

3. A method as in claim 1, wherein the resist is an electron beam resist having a thickness in the range from about 0.2 to 2 μm.

4. A method as in claim 1, wherein the resist is an x-ray resist having a thickness in the range from about 0.2 to 2 μm.

5. A method as in claim 1, wherein the aluminum layer is formed by sputtering or evaporation.

6. A method as in claim 1, wherein the aluminum layer is wet etched.

7. A method as in claim 1, wherein the aluminum layer is dry etched.

* * * * *